(12) United States Patent
De La Cruz

(10) Patent No.: US 12,021,458 B2
(45) Date of Patent: Jun. 25, 2024

(54) CIRCUIT BOARD COMPRISING A RECTIFIER BRIDGE

(71) Applicant: SAGEMCOM ENERGY & TELECOM SAS, Rueil Malmaison (FR)

(72) Inventor: Fabien De La Cruz, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 16/657,710

(22) Filed: Oct. 18, 2019

(65) Prior Publication Data
US 2020/0127579 A1    Apr. 23, 2020

(30) Foreign Application Priority Data

Oct. 19, 2018   (FR) ...................... 18 59698

(51) Int. Cl.
*H02M 7/06*   (2006.01)
*G01R 15/00*  (2006.01)
(Continued)

(52) U.S. Cl.
CPC ............ *H02M 7/06* (2013.01); *G01R 15/005* (2013.01); *H01L 23/5386* (2013.01);
(Continued)

(58) Field of Classification Search
CPC .......... H02M 7/00; H02M 7/06; H02M 7/155; H02M 7/217; H02M 1/44; H05K 1/02; H05K 1/0228; H05K 1/0265; H05K 1/18; H05K 1/181–187; H05K 2201/09309; H05K 2201/10174; H05K 2201/10636; G01R 22/00
(Continued)

(56) References Cited

U.S. PATENT DOCUMENTS 4,736,148 A  *  4/1988  Hirata ................. H02M 5/4505
                                                     318/723
5,136,458 A  *  8/1992  Durivage, III ........... H02H 3/00
                                                     361/93.2
(Continued)

FOREIGN PATENT DOCUMENTS

EP            3107120 A1    12/2016

*Primary Examiner* — Tuan T Dinh
(74) *Attorney, Agent, or Firm* — Muncy, Geissler, Olds & Lowe, P.C.

(57) ABSTRACT

Circuit board comprising a printed circuit comprising phase conductors, each of which is arranged so as to be connected to one phase of a multiphase line, the circuit board further comprising a rectifier bridge comprising phase diodes that are mounted on one and the same face of the printed circuit, the phase diodes comprising, for each phase conductor, one pair of phase diodes comprising a first phase diode having an anode that is connected to said phase conductor and a second phase diode having a cathode that is connected to said phase conductor, the pairs of phase diodes lying in succession along a positioning axis on the face of the printed circuit, the first phase diode and the second phase diode of each pair of phase diodes being positioned in parallel but inverted with respect to each other.

13 Claims, 4 Drawing Sheets

(51) Int. Cl.
*H01L 23/538* (2006.01)
*H01L 25/07* (2006.01)
*H02M 7/00* (2006.01)
*G01R 22/00* (2006.01)

(52) U.S. Cl.
CPC .......... *H01L 25/072* (2013.01); *H02M 7/003* (2013.01); *G01R 22/00* (2013.01)

(58) Field of Classification Search
USPC ....... 363/145–147, 126; 310/68 B, 68 D, 71; 361/760–784
See application file for complete search history.

(56) References Cited

U.S. PATENT DOCUMENTS

| | | | | |
|---|---|---|---|---|
| 5,436,785 | A * | 7/1995 | Ferrazzi | H02H 3/0935 361/42 |
| 5,640,062 | A * | 6/1997 | Yockey | H02K 11/046 310/68 B |
| 5,654,882 | A * | 8/1997 | Kanazawa | H02M 1/4216 363/37 |
| 6,239,582 | B1 * | 5/2001 | Buzan | H02J 7/1492 320/137 |
| 6,239,995 | B1 * | 5/2001 | Weng | H02M 1/4216 363/44 |
| 6,549,409 | B1 * | 4/2003 | Saxelby, Jr. | H05K 1/0203 174/548 |
| 7,629,720 | B2 * | 12/2009 | Koumura | H02K 11/05 310/88 |
| 7,800,921 | B2 * | 9/2010 | Zhu | H02M 3/33507 363/141 |
| 8,400,775 | B2 * | 3/2013 | Ward | H02M 7/003 361/803 |
| 8,970,148 | B2 * | 3/2015 | Vrankovic | H02P 23/28 318/801 |
| 10,321,569 | B1 * | 6/2019 | Butler | H05K 1/115 |
| 2005/0082930 | A1 * | 4/2005 | Kashihara | H01L 25/115 310/179 |
| 2005/0270745 | A1 * | 12/2005 | Chen | H01F 27/2804 361/707 |
| 2008/0164851 | A1 * | 7/2008 | Ganev | H02M 7/493 322/8 |
| 2010/0284155 | A1 * | 11/2010 | Stolze | H01L 23/49811 361/728 |
| 2011/0044080 | A1 * | 2/2011 | Ristimaki | H02M 1/32 363/126 |
| 2012/0154167 | A1 * | 6/2012 | Jones | H02H 9/042 340/815.45 |
| 2012/0170338 | A1 * | 7/2012 | Trainer | H02M 7/483 363/127 |
| 2012/0319630 | A1 * | 12/2012 | Li | H02M 1/4216 318/400.3 |
| 2013/0106255 | A1 * | 5/2013 | Tamura | H02M 7/003 310/68 D |
| 2013/0194838 | A1 * | 8/2013 | Jang | H02M 1/4216 363/37 |
| 2014/0254205 | A1 * | 9/2014 | Trainer | H02M 3/335 363/17 |
| 2015/0123612 | A1 * | 5/2015 | Ide | B60L 53/22 320/109 |
| 2015/0171619 | A1 * | 6/2015 | Araujo Ortega | H02H 3/22 361/119 |
| 2016/0165680 | A1 * | 6/2016 | Johnson | F21V 23/005 438/23 |
| 2017/0279287 | A1 * | 9/2017 | Solodovnik | H02J 7/007182 |
| 2018/0263087 | A1 * | 9/2018 | Miskin | H05B 45/382 |

* cited by examiner

CIRCUIT BOARD COMPRISING A RECTIFIER BRIDGE

The invention relates to the field of circuit boards comprising a rectifier bridge.

BACKGROUND OF THE INVENTION

It is very common practice to use rectifier bridges to produce a DC voltage from an AC voltage delivered to a circuit board via any type of electrical line or via any type of electrical conductor.

Thus, a rectifier bridge is conventionally employed in an electricity meter connected to an electricity transmission line and intended to measure the electricity consumption of an installation. When the line is a three-phase line, a rectifier bridge with eight diodes is used. The eight diodes comprise six diodes that are intended to be connected to the three phases and two diodes that are intended to be connected to the neutral, if a neutral is used.

Designers of circuit boards and therefore, in particular, of circuit boards comprising a rectifier bridge are well aware that, to decrease parasitic emissions, it is important in particular to avoid "accidental" antennas.

Any metal interconnection may constitute an accidental antenna. If a radiofrequency current flows through the antenna-forming interconnection, or if its potential fluctuates, then it may emit parasitic energy in the form of electromagnetic waves.

There are two types of radiating mechanism that generate parasitic emissions.

The radiation may be induced by a current loop or flow, which result in a primarily magnetic field.

The radiation may also be induced by a difference in potential, which results in a primarily electric field.

One solution for reducing parasitic emissions consists in decreasing large inrush currents and voltage fluctuations by adding passive filters or decoupling capacitors.

This solution requires the use of a certain number of components that are dedicated to meeting standard electromagnetic compatibility requirements. These components are relatively expensive. They take up a non-negligible area on the circuit board, thereby increasing the size and weight of the circuit board. Implementing this solution also increases the time taken to develop the circuit board, and requires it to pass through the electromagnetic compatibility laboratory a certain number of times in order to validate the design and verify that the standard requirements have been met.

It should also be noted that the application in which the circuit board is used often imposes design constraints that are specific to said application. Thus, in the case of electricity meters, it is sometimes necessary for all of the electrical components to be installed on the same side of the circuit board. It is sometimes also a requirement that the circuit board comprise two layers of copper only.

The chosen solution for decreasing parasitic emissions must be compatible with these design constraints.

OBJECT OF THE INVENTION

The object of the invention is a solution allowing the parasitic emissions generated by a circuit board comprising a rectifier bridge, the electrical components of the circuit board being positioned on one and the same face of the circuit board, to be decreased in a straightforward and inexpensive manner.

SUMMARY OF THE INVENTION

With a view to achieving this object, what is proposed is a circuit board comprising a printed circuit comprising phase conductors, each of which is arranged so as to be connected to one phase of a multiphase line, the circuit board further comprising a rectifier bridge comprising phase diodes that are mounted on one and the same face of the printed circuit, the phase diodes comprising, for each phase conductor, one pair of phase diodes comprising a first phase diode having an anode that is connected to said phase conductor and a second phase diode having a cathode that is connected to said phase conductor, the pairs of phase diodes lying in succession along a positioning axis on the face of the printed circuit, the first phase diode and the second phase diode of each pair of phase diodes being positioned in parallel but inverted with respect to each other.

The layout of the phase diodes of the rectifier bridge allows both the number and area of current loops and the number of intersections between two tracks on the circuit board to be decreased.

The parasitic emissions generated by the circuit board are thus decreased in a straightforward and inexpensive manner. Specifically, this solution makes no use of additional protection components, which are relatively expensive and bulky, and the implementation of which requires substantial design and test efforts.

It should be noted that the phase diodes are mounted on one and the same face of the printed circuit, such that the circuit board according to the invention is compatible with the requirements mentioned above (installation of the components on the same side of the circuit board, and circuit board with two layers).

Also proposed is an electricity meter comprising a circuit board such as described above.

The invention will be better understood in the light of the following description of one particular nonlimiting implementation of the invention.

BRIEF DESCRIPTION OF THE DRAWINGS

Reference will be made to the appended drawings, in which.

DETAILED DESCRIPTION OF THE INVENTION

Figure 1:
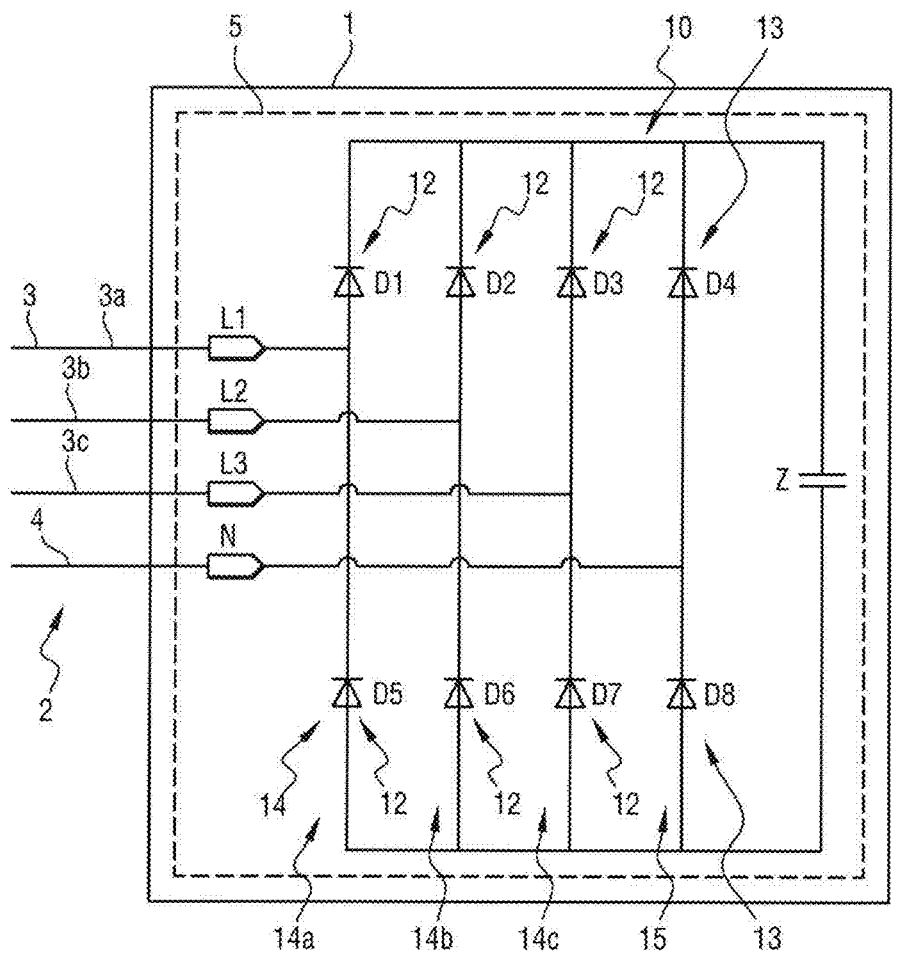
FIG. 1 shows a rectifier bridge with eight diodes.

With reference to FIG. 1, the invention is here implemented in an electricity meter 1. The meter 1 is connected to an electricity transmission line which is a multiphase line, in this instance a three-phase line 2.

The three-phase line 2 comprises three phases 3 and a neutral 4. Each phase 3 of the three-phase line 2 carries an AC phase current, at an AC phase voltage. The three phase voltages are phase-offset by 120° and use the neutral 4 as reference.

The meter 1 is used to measure the electricity delivered by the three-phase line 2 to an electrical installation.

The electricity delivered to the electrical installation takes the form of a DC supply current at a DC supply voltage. The meter 1 therefore rectifies the phase voltages in order to obtain this DC supply voltage.

The meter 1 comprises a circuit board 5 according to the invention. The circuit board 5 comprises a printed circuit with two layers of copper comprising a signal layer and a ground plane.

The printed circuit comprises phase conductors L1, L2, L3, each of which is connected to one distinct phase 3 of the three-phase line 2. The phase conductors L1, L2, L3 are here tracks that are formed on the signal layer; each of these tracks is connected to one of the phases 3.

The printed circuit also comprises a neutral conductor N that is connected to the neutral 4 of the three-phase line 2. The neutral conductor N is here the ground plane.

To rectify the phase voltages, the circuit board 5 comprises a rectifier bridge 10. The output of the rectifier bridge 10 is here connected to an impedance Z.

The impedance Z represents the equivalent impedance of the electricity meter. The voltage across the terminals of the impedance Z is close to a DC voltage.

The rectifier bridge 10 comprises phase diodes 12 and neutral diodes 13.

The phase diodes 12 comprise, for each phase conductor, one pair of phase diodes 14 comprising a first phase diode having an anode that is connected to said phase conductor and a second phase diode having a cathode that is connected to said phase conductor. The phase diodes 12 therefore comprise three pairs of phase diodes 14, i.e. six phase diodes 12.

A first pair of phase diodes 14a, connected to a first phase conductor L1 (and hence to a first phase 3a), comprises a first phase diode D1 and a second phase diode D5.

A second pair of phase diodes 14b, connected to a second phase conductor L2 (and hence to a second phase 3b), comprises a first phase diode D2 and a second phase diode D6.

A third pair of phase diodes 14c, connected to a third phase conductor L3 (and hence to a third phase 3c), comprises a first phase diode D3 and a second phase diode D7.

The neutral diodes 13 comprise a pair of neutral diodes 15 comprising a first neutral diode D4 and a second neutral diode D8.

The first neutral diode D4 has an anode that is connected to the neutral conductor N (and hence to the neutral 4) and the second neutral diode D8 has a cathode that is connected to the neutral conductor N (and hence to the neutral 4).

The phase diodes 12 and the neutral diodes 13 are here all S1Y diodes from the manufacturer Diotec, each having a voltage $V_{RRM}$ equal to 2000 V and a current $I_{FAV}$ equal to 1 A.

The phase diodes 12 and the neutral diodes 13 are mounted on one and the same face of the printed circuit.

The routes for the flow of currents through the rectifier bridge 10 are as follows:

for the positive half-waves:
  L1-D1-Z-D8-N;
  L2-D2-Z-D8-N;
  L3-D3-Z-D8-N.

for the negative half-waves:
  L1-D5-Z-D4-N;
  L2-D6-Z-D4-N;
  L3-D7-Z-D4-N.

The solution proposed here allows current loops to be limited to those that are strictly operationally necessary, and track intersections to be limited as far as possible. Track intersections lead to signal superpositions that may result in coupling through capacitive crosstalk. It is therefore necessary to limit intersections in order to improve the electromagnetic behaviour of the circuit board 5.

Figure 2:
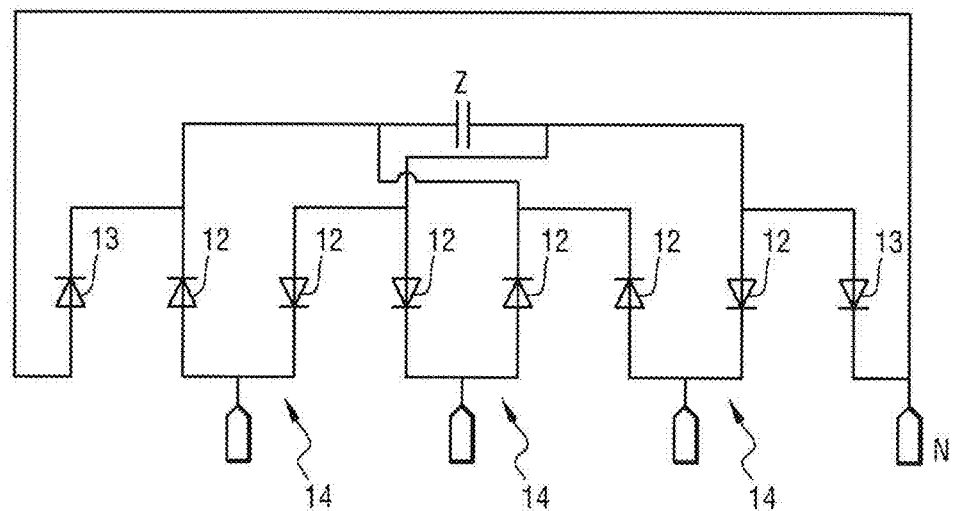
FIG. 2 is a circuit diagram showing a general layout, on the circuit board according to the invention, of the diodes of the rectifier bridge.

To this end, on the circuit board 5 according to the invention, the diodes are positioned in accordance with a general layout, which can be seen in FIG. 2.

Figure 3:
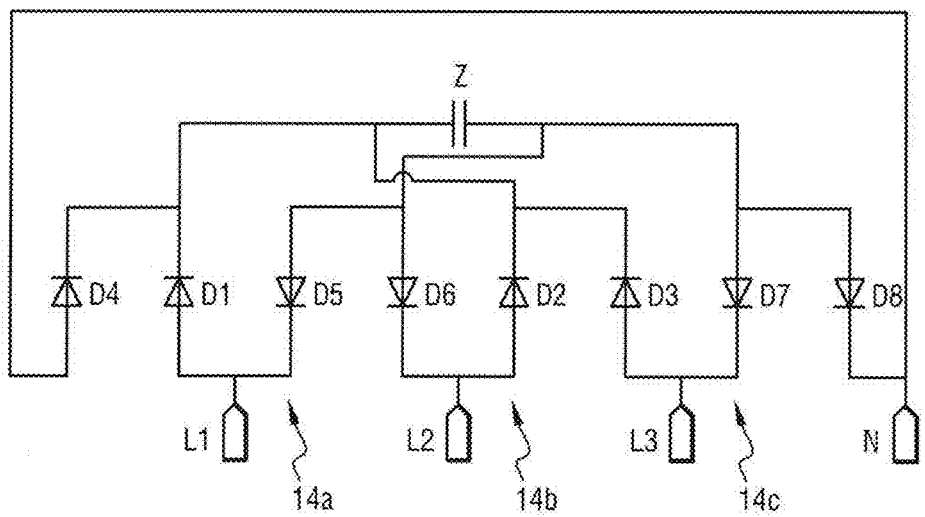
FIG. 3 is a circuit diagram showing a first example of a particular layout, in accordance with the general layout, of the diodes of the rectifier bridge.

A first example of a particular layout, in accordance with the general layout, can be seen in FIG. 3.

Figure 4:
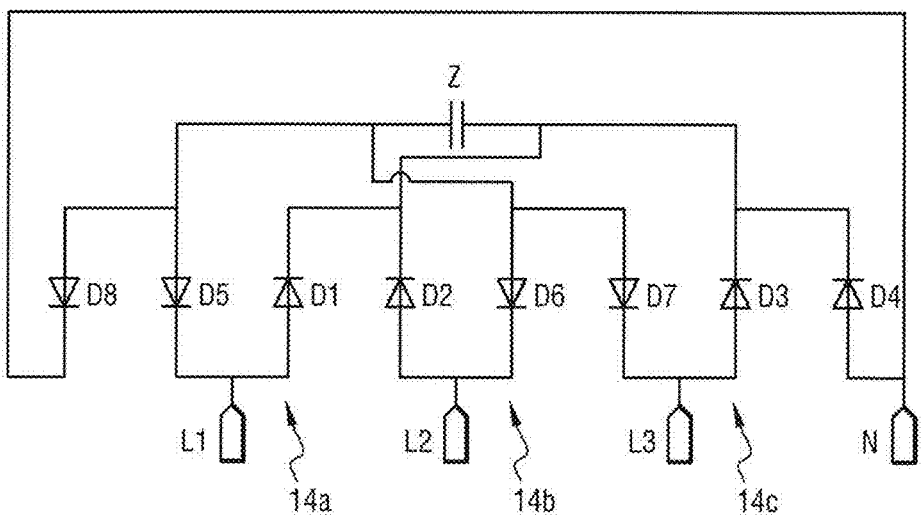
FIG. 4 is a circuit diagram showing a second example of a particular layout, in accordance with the general layout, of the diodes of the rectifier bridge.

A second example of a particular layout, in accordance with the general layout, can be seen in FIG. 4.

If the order of the phases and of the neutral, and hence of the phase conductors and of the neutral conductor, is reversed, for example, L1, L3, L2, N or L2, L1, L3, N or L2, L3, L1, N or L3, L1, L2, N or L3, L2, L1, N or L1, L3, N, L2 or L2, L1, N, L3 or L2, L3, N, L1 or L3, L1, N, L2 or L3, L2, N, L1 or L1, N, L3, L2 or L2, N, L1, L3 or L2, N, L3, L1 or L3, N, L1, L2 or L3, N, L2, L1 or N, L1, L3, L2 or N, L2, L1, L3 or N, L2, L3, L1 or N, L3, L1, L2 or N, L3, L2, L1, it is still necessary to observe the alternation in the direction of the diodes (anode upwards or downwards) per pair.

Figure 5:
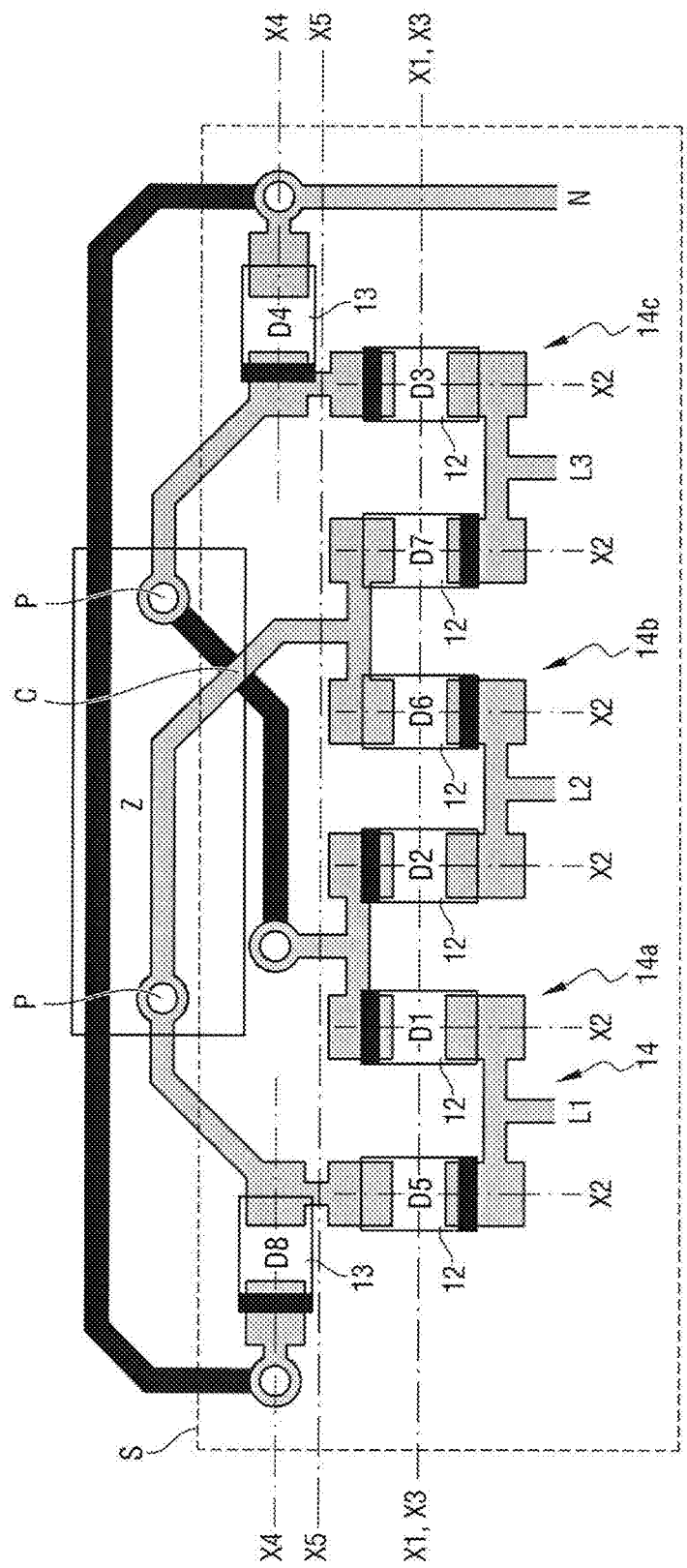
FIG. 5 shows the phase diodes and the neutral diodes of the rectifier bridge on an installation diagram of the circuit board according to the invention.

The layout of the phase diodes 12 and of the neutral diodes 13 will now be described in greater detail with reference to FIG. 5.

As described above, the phase diodes 12 and the neutral diodes 13 are mounted on one and the same face of the printed circuit.

The pairs of phase diodes 14 lie in succession along a positioning axis X1.

Thus, here, the first pair of phase diodes 14a, the second pair of phase diodes 14b and the third pair of phase diodes 14c, connected to the first phase conductor L1, to the second phase conductor L2 and to the third phase conductor L3, respectively, are positioned in succession, from left to right, along the positioning axis X1.

In each pair of phase diodes 14, the first phase diode and the second phase diode are positioned in parallel but inverted with respect to each other, such that the anode of the first phase diode is connected to the corresponding phase conductor and the cathode of the second phase diode is connected to the corresponding phase conductor.

Thus, for example, the first phase diode D1 and the second phase diode D5 are positioned in parallel but inverted with respect to each other, such that the anode of the first phase diode D1 is connected to the first phase conductor L1 and the cathode of the second phase diode D5 is connected to the first phase conductor L1.

In each pair of phase diodes 14, the cathode of the first phase diode is connected to the cathode of the first phase diode of the pair of phase diodes that is closest to said first phase diode, and/or the anode of the second phase diode is connected to the anode of the second phase diode of the pair of phase diodes that is closest to said second phase diode.

Here, in this instance, the cathode of the first phase diode D1 is connected to the cathode of the first phase diode D2, and the anode of the second phase diode D6 is connected to the anode of the second phase diode D7.

Each phase diode 12 has a phase diode axis X2 that passes through a central point, through the anode and through the cathode of said phase diode 12. The phase diode axes X2 are parallel to one another and are perpendicular to the positioning axis X1. Thus, the phase diodes 12 are all parallel to one another.

The central points of the phase diodes 12 are aligned along an alignment axis X3 that is parallel to the positioning axis X1. The term "parallel" is understood here to mean parallel or coincident. Thus, the phase diodes 12 are here all perfectly aligned.

The first neutral diode D4 and the second neutral diode D8 are positioned such that the first neutral diode D4, the pairs of phase diodes and then the second neutral diode D8 lie in succession along the positioning axis X1.

The cathode of the first neutral diode is connected to the cathode of the first phase diode of the pair of phase diodes that is closest to the first neutral diode. The anode of the second neutral diode is connected to the anode of the second phase diode of the pair of phase diodes that is closest to the second neutral diode.

Here, in this instance, the cathode of the first neutral diode D4 is connected to the cathode of the first phase diode D3, and the anode of the second neutral diode D8 is connected to the anode of the second phase diode D5.

Each neutral diode 13 has a neutral diode axis X4 that passes through a central point, through the anode and through the cathode of said neutral diode 13. The neutral diode axes X4 are coincident and are parallel to the positioning axis X1.

The first neutral diode D4 and the second neutral diode D8 are positioned in parallel and facing the same direction.

The phase diodes 12 are located in a first half-plane and the neutral diodes 13 are located in a second half-plane. The first half-plane and the second half-plane are defined by a separation axis X5 that is parallel to the positioning axis X1.

It should also be noted that the phase diodes 12 and the neutral diodes 13 are installed within an installation area S, and that the output of the rectifier bridge, i.e. the points P of connection to the impedance Z, is located facing a central portion of the installation area S.

By virtue of this installation layout, the number of current loops has been limited to those that are strictly operationally necessary, i.e. for the flow of the positive half-waves and negative half-waves of the current.

The installation layout features only one intersection C, and is very compact.

This solution is very efficient, in particular in the case that the phase and neutral diodes and, more generally, the components of the circuit board have to be mounted on one and the same face of a circuit board having a printed circuit comprising two layers of copper only.

Figure 6:
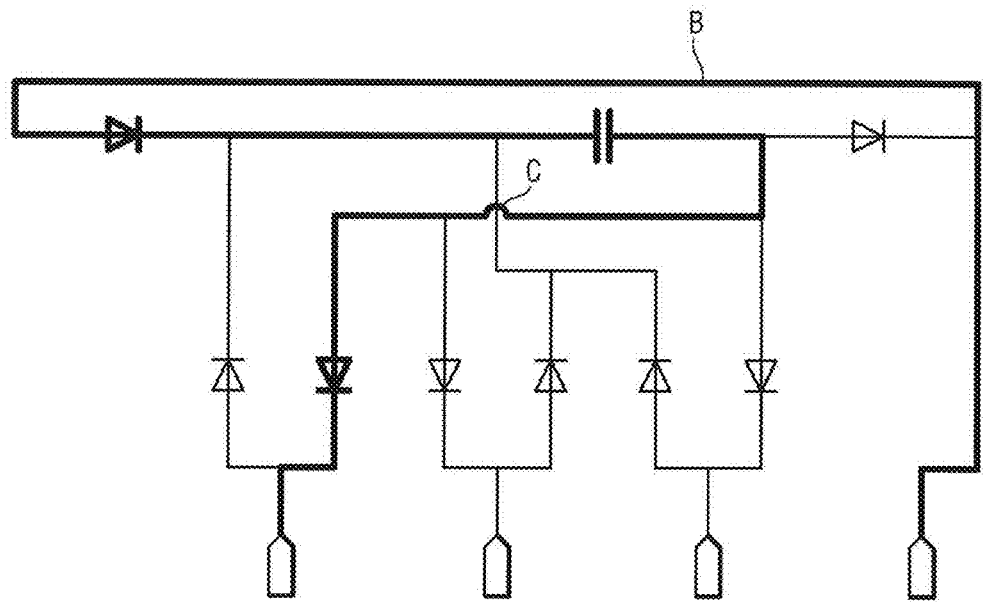
FIG. 6 is a circuit diagram showing a third example of a particular layout, in accordance with the general layout, of the diodes of the rectifier bridge, on which a current loop features.

With reference to FIG. 6, it may be seen that, in the case of the circuit board according to the invention, the area of the largest current loop B is relatively small. Furthermore, it should again be noted that the tracks intersect only once at the point C, thereby limiting the superposition of the signals.

Figure 7:
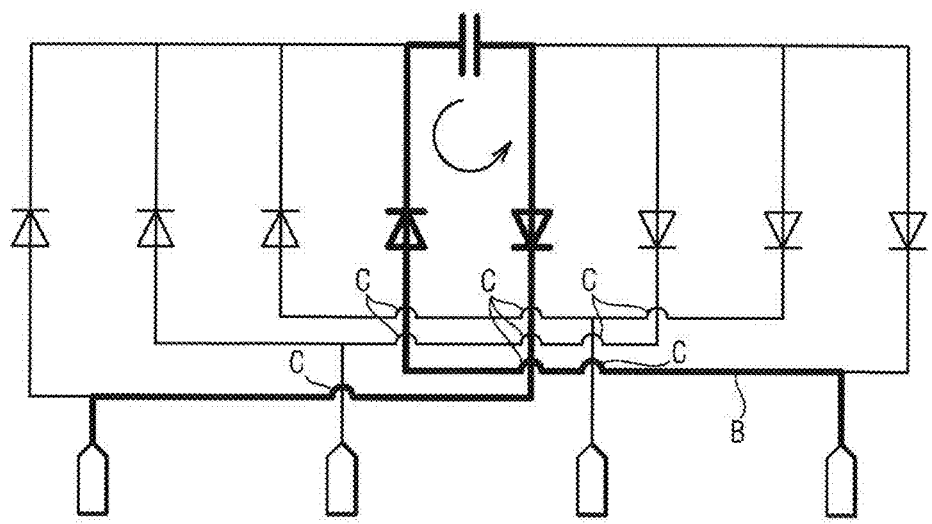
FIG. 7 is a circuit diagram showing a fourth example of a particular layout, not in accordance with the general layout, of the diodes of the rectifier bridge, on which a current loop features.

By comparison, with reference to FIG. 7, it may be seen that, in the case of a circuit board not in accordance with the invention, the area of the largest current loop B is greater. Moreover, it may be seen that the tracks intersect nine times at the points C. This circuit board not in accordance with the invention is clearly not as performant in terms of parasitic emissions.

Of course, the invention is not limited to the embodiment described but encompasses all variants that come within the scope of the invention as defined by the claims.

The invention is of course applicable to any multiphase line, regardless of the number of phases.

The circuit board according to the invention is not necessarily incorporated within an electricity meter. The multiphase line is not necessarily a line for transmitting electricity to an installation. The invention may thus be implemented in any type of application in which a rectifier bridge is connected to a multiphase conductor or line.

The type and model of the diodes used are of course given by way of illustration and may differ.

The number of diodes in the rectifier bridge may of course differ, in particular if the number of phases of the multiphase line is different.

The invention claimed is:

1. A circuit board comprising:
   a printed circuit comprising phase conductors, each of which is arranged so as to be connected to one phase of a multiphase line; and
   a rectifier bridge comprising phase diodes that are mounted on one and the same face of the printed circuit, the phase diodes comprising, for each phase conductor, a first phase diode having an anode that is connected to said phase conductor and a second phase diode having a cathode that is connected to said phase conductor, the first phase diode and the second phase diode of each phase conductor forming a pair of phase diodes, all the first phase diodes and second phase diodes lying in succession along one single positioning axis on the face of the printed circuit, the first phase diode and the second phase diode of each pair of phase diodes being positioned in parallel but inverted with respect to each other; an output of the rectifier bridge is connected to an impedance such that a voltage across terminals of the impedance is close to a DC voltage.

2. The circuit board according to claim 1, wherein, in each pair of phase diodes, a cathode of the first phase diode is connected to a cathode of a first phase diode of a pair of phase diodes that is closest to said first phase diode, and/or an anode of the second phase diode is connected to an anode of a second phase diode of a pair of phase diodes that is closest to said second phase diode.

3. The circuit board according to claim 1, wherein each phase diode has a phase diode axis that passes through a central point, through the anode and through the cathode of said phase diode, the phase diode axes being parallel to one another and being perpendicular to the positioning axis.

4. The circuit board according to claim 3, wherein the central points of the phase diodes are aligned along an alignment axis that is parallel to the positioning axis.

5. The circuit board according to claim 1, the printed circuit further comprising a neutral conductor that is arranged so as to be connected to a neutral of the multiphase line, the rectifier bridge further comprising a pair of neutral diodes comprising a first neutral diode and a second neutral diode that are mounted on the same face of the printed circuit, the first neutral diode having an anode that is connected to the neutral conductor and the second neutral diode having a cathode that is connected to the neutral conductor, the first neutral diode and the second neutral diode being positioned such that the first neutral diode, the pairs of phase diodes and then the second neutral diode lie in succession along the positioning axis on the face of the printed circuit.

6. The circuit board according to claim 5, wherein a cathode of the first neutral diode is connected to the cathode of a first phase diode of a pair of phase diodes that is closest to said first neutral diode, and wherein an anode of the second neutral diode is connected to the anode of a second phase diode of a pair of phase diodes that is closest to said second neutral diode.

7. The circuit board according to claim 5, wherein each neutral diode has a neutral diode axis that passes through a central point, through the anode and through the cathode of said neutral diode, the neutral diode axes being coincident and being parallel to the positioning axis.

8. The circuit board according to claim 5, wherein the first neutral diode and the second neutral diode are positioned in parallel and facing a same direction.

9. The circuit board according to claim 5, wherein the phase diodes are located in a first half-plane and the neutral diodes are located in a second half-plane, the first half-plane and the second half-plane being defined by a separation axis that is parallel to the positioning axis.

10. The circuit board according to claim 5, wherein the phase diodes and the neutral diodes are installed within an installation area, and wherein an output of the rectifier bridge is located facing a central portion of the installation area.

11. The circuit board according to claim 5, wherein the neutral conductor is a ground plane of the printed circuit.

12. The circuit board according to claim 1, wherein the printed circuit has two layers of copper.

13. An electricity meter comprising a circuit board according to claim 1.

* * * * *